United States Patent
Hong et al.

(10) Patent No.: US 9,786,814 B2
(45) Date of Patent: Oct. 10, 2017

(54) ULTRAVIOLET LIGHT EMITTING DEVICE

(71) Applicant: LG INNOTEK CO., LTD., Seoul (KR)

(72) Inventors: Yee Rang Hong, Seoul (KR); Woon Kyung Choi, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/712,422

(22) Filed: Dec. 12, 2012

(65) Prior Publication Data
US 2013/0146920 A1 Jun. 13, 2013

(30) Foreign Application Priority Data

Dec. 13, 2011 (KR) .................. 10-2011-0134019
Nov. 5, 2012 (KR) .................. 10-2012-0124003

(51) Int. Cl.
| | |
|---|---|
| H01L 33/36 | (2010.01) |
| H01L 33/60 | (2010.01) |
| H01L 33/38 | (2010.01) |
| H01L 33/40 | (2010.01) |
| H01L 33/20 | (2010.01) |

(52) U.S. Cl.
CPC ............. *H01L 33/36* (2013.01); *H01L 33/38* (2013.01); *H01L 33/405* (2013.01); *H01L 33/60* (2013.01); *H01L 33/20* (2013.01); *H01L 2224/48091* (2013.01); *H01L 2224/48247* (2013.01); *H01L 2224/48257* (2013.01); *H01L 2924/181* (2013.01)

(58) Field of Classification Search
None
See application file for complete search history.

(56) References Cited

U.S. PATENT DOCUMENTS

| | | | |
|---|---|---|---|
| 5,557,115 A | 9/1996 | Shakuda | |
| 5,814,841 A * | 9/1998 | Kusuda et al. | 257/113 |
| 5,861,636 A * | 1/1999 | Dutta et al. | 257/91 |
| 6,445,011 B1 * | 9/2002 | Hirano et al. | 257/99 |
| 7,411,220 B2 | 8/2008 | Horio et al. | |
| 2004/0248421 A1 * | 12/2004 | Yorita | B81C 99/0085 438/719 |
| 2005/0006651 A1 * | 1/2005 | LeBoeuf et al. | 257/79 |

(Continued)

FOREIGN PATENT DOCUMENTS

| | | |
|---|---|---|
| JP | 56-50586 A | 5/1981 |
| JP | 2004-281553 A | 10/2004 |

(Continued)

*Primary Examiner* — Angel Roman
*Assistant Examiner* — Kevin Quinto
(74) *Attorney, Agent, or Firm* — Birch, Stewart, Kolasch & Birch, LLP

(57) ABSTRACT

The ultraviolet light emitting device includes a substrate; a light emitting structure on the substrate, and including a plurality of compound semiconductors, each including at least a first conductive semiconductor layer, an active layer, and a second conductive semiconductor layer; a first electrode layer on the first conductive semiconductor layer; and a second electrode layer on the second conductive semiconductor layer. The first electrode layer is spaced apart from a side surface of the active layer, and is provided along a peripheral portion of the active layer. At least one of the first and second electrode layers is a reflective layer.

18 Claims, 10 Drawing Sheets

(56) References Cited

U.S. PATENT DOCUMENTS

| | | | |
|---|---|---|---|
| 2005/0087755 A1 | 4/2005 | Kim et al. | |
| 2005/0104081 A1* | 5/2005 | Kim et al. | 257/99 |
| 2005/0281303 A1* | 12/2005 | Horio | H01L 33/08 |
| | | | 372/44.01 |
| 2005/0285127 A1* | 12/2005 | Noto et al. | 257/96 |
| 2006/0054909 A1 | 3/2006 | Shin et al. | |
| 2006/0057817 A1* | 3/2006 | Sonoda et al. | 438/455 |
| 2006/0145174 A1* | 7/2006 | Lee | H01L 33/20 |
| | | | 257/98 |
| 2008/0281385 A1 | 11/2008 | Inada et al. | |
| 2008/0293231 A1 | 11/2008 | Goshonoo et al. | |
| 2009/0019347 A1 | 1/2009 | Noguchi et al. | |
| 2009/0090932 A1 | 4/2009 | Bour et al. | |
| 2010/0051994 A1 | 3/2010 | Katsuno et al. | |
| 2010/0078670 A1 | 4/2010 | Kim et al. | |
| 2010/0213467 A1* | 8/2010 | Lee et al. | 257/75 |
| 2011/0049541 A1 | 3/2011 | Katsuno et al. | |
| 2012/0161113 A1* | 6/2012 | Lowenthal | H01L 25/048 |
| | | | 257/40 |

FOREIGN PATENT DOCUMENTS

| | | |
|---|---|---|
| JP | 2005-303286 A | 10/2005 |
| JP | 2006-5215 A | 1/2006 |
| JP | 2006-12916 A | 1/2006 |
| JP | 2006-287026 A | 10/2006 |
| JP | 2007-103689 A | 4/2007 |
| JP | 2007-151807 A | 6/2007 |
| JP | 2007-184411 A | 7/2007 |
| JP | 2007-235122 A | 9/2007 |
| WO | 2007/005984 A1 | 1/2007 |

* cited by examiner

ULTRAVIOLET LIGHT EMITTING DEVICE

The present application claims priority under 35 U.S.C. §119(a) of Korean Patent Application No. 10-2011-0134019 filed on Dec. 13, 2011 and Korean Patent Application No. 10-2012-0124003 filed on Nov. 5, 2012, which are hereby incorporated by reference in their entirety.

BACKGROUND

The embodiment relates to a light emitting device.

A light emitting diode (LED) is a semiconductor light emitting device to convert current into light.

Since the semiconductor light emitting device can obtain light having high brightness, the semiconductor light emitting device has been extensively used as a light source for a display, a vehicle, or a lighting device.

Recently, an ultraviolet light emitting device capable of outputting ultraviolet light has been suggested.

Although the ultraviolet light is output out of the ultraviolet light emitting device, the greater quantity of the ultraviolet light is not output to the outside, but absorbed or disappeared in the ultraviolet light emitting device. Accordingly, the light extraction efficiency may be lowered.

SUMMARY

The embodiment provides an ultraviolet light emitting device having improved light extraction efficiency.

According to the embodiment, there is provided an ultraviolet light emitting device including a substrate; a light emitting structure on the substrate, and including a plurality of compound semiconductors, each including at least a first conductive semiconductor layer, an active layer, and a second conductive semiconductor layer; a first electrode layer on the first conductive semiconductor layer; and a second electrode layer on the second conductive semiconductor layer, wherein the first electrode layer is spaced apart from a side surface of the active layer, and is provided along a peripheral portion of the active layer, and wherein at least one of the first and second electrode layers is a reflective layer.

According to the embodiment, there is provided an ultraviolet light emitting device including a substrate; a light emitting structure on the substrate and including a plurality of compound semiconductors, each including at least a first conductive semiconductor layer, an active layer, and a second conductive semiconductor layer, a bottom surface of the first conductive semiconductor layer comprising a center portion and a peripheral portion surrounding the center portion, and the center portion protruding with respect to the peripheral portion; a first electrode layer on the first conductive semiconductor layer; a protective layer between a side surface of the active layer and the first electrode layer; and a second electrode layer on the second conductive semiconductor layer, wherein the first electrode layer is provided along a peripheral portion of the active layer, and wherein at least one of the first and second electrode layers is a reflective layer.

According to the embodiment, there is provided an ultraviolet light emitting device including a substrate comprising a light emitting region and a non-light emitting region surrounding the light emitting region; a light emitting structure on the substrate and including a plurality of compound semiconductors, each including at least a first conductive semiconductor layer, an active layer, and a second conductive semiconductor layer, the first conductive semiconductor layer, the active layer and the second conductive semiconductor layer formed on the light emitting region, and the first conductive semiconductor layer formed on the non-light emitting region; an ohmic layer on the bottom surface of the first conductive semiconductor layer in the non-light emitting region; a first electrode layer on the first conductive semiconductor layer and the ohmic layer; and a second electrode layer on the second conductive semiconductor layer, wherein the ohmic layer and the first electrode layer are spaced apart from a side surface of the active layer, and wherein at least one of the first and second electrode layers is a reflective layer.

DETAILED DESCRIPTION OF THE EMBODIMENTS

Figure 1:
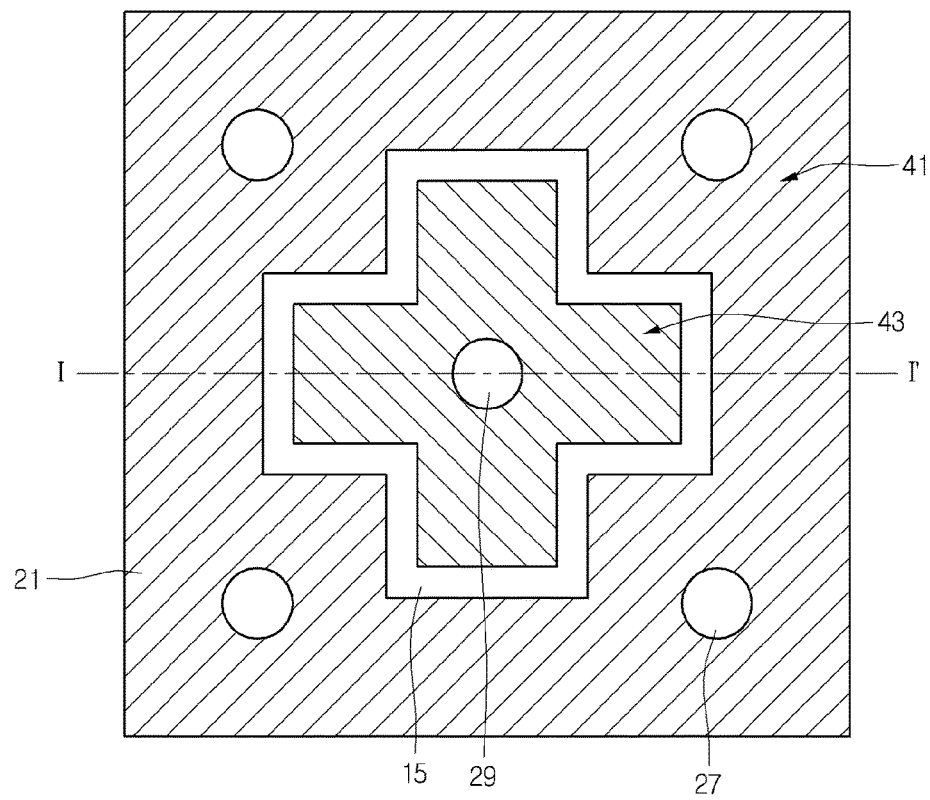
FIG. 1 is a bottom view showing an ultraviolet light emitting device according to a first embodiment.

In the following description of the embodiments, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present. Such a position of the layer has been described with reference to the drawings.

Hereinafter, the embodiments will be described with reference to the accompanying drawings. The thickness and size of each layer shown in the drawings may be exaggerated, omitted or schematically drawn for the purpose of convenience or clarity. In addition, the size of elements does not utterly reflect an actual size.

Although the following description is made in that an ultraviolet light emitting device is limited to a flip-type ultraviolet light emitting device including a substrate provided at an upper portion thereof and first and second electrodes 27 and 29 provided at a lower portion thereof, the embodiment is not limited thereto.

Although the ultraviolet light emitting device produces deep ultraviolet light having a wavelength of 240 nm to 360 nm in the following description, the embodiment is not limited thereto.

Figure 2:
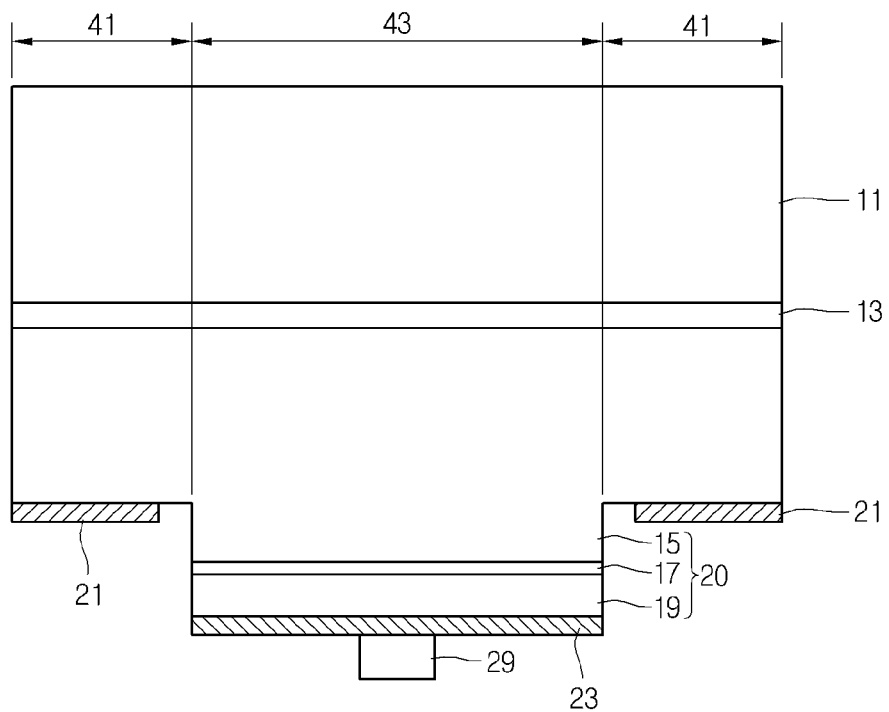
FIG. 2 is a sectional view showing the ultraviolet light emitting device of FIG. 1.

FIG. 1 is a bottom view showing the ultraviolet light emitting device according to the first embodiment, and FIG. 2 is a sectional view showing the ultraviolet light emitting device of FIG. 1.

Referring to FIGS. 1 and 2, an ultraviolet light emitting device 10 according to the first embodiment may include a substrate 11, a first conductive semiconductor layer 15, an active layer 17, a second conductive semiconductor layer 19, first and second electrode layers 21 and 23, and first and second electrodes 27 and 29.

The ultraviolet light emitting device 10 according to the first embodiment may include a flip-type ultraviolet light emitting device, but the embodiment is not limited thereto.

A light emitting structure 20 may be formed by the first conductive semiconductor layer 15, the active layer 17, and the second conductive semiconductor layer 19.

The light emitting structure 20 may include a plurality of compound semiconductor layers. Among the compound semiconductor layers, one layer serves as the active layer 17 to produce light, another layer serves as the first conductive semiconductor layer 15 to produce first carriers, that is, electrons to be supplied to the active layer 17, and still another layer serves as the second conductive semiconductor layer 19 to produce second carriers, that is, holes to be supplied to the active layer 17, but the embodiment is not limited thereto. The light may be produced in the active layer 17 through the recombination of the electrons and the holes. For example, the first conductive semiconductor layer 15 may be provided on the active layer 17, and the second conductive semiconductor layer 19 may be provided under the active layer 17, but the embodiment is not limited thereto.

The ultraviolet light emitting device 10 further includes a buffer layer 13 between the substrate 11 and the first conductive semiconductor layer 15 in order to reduce the lattice mismatch between the substrate 11 and the first conductive semiconductor layer 15, but the embodiment is not limited thereto.

The buffer layer 13 prevents defects such as cracks, voids, grains, and bowings from occurring in the first conductive semiconductor layer 15, the active layer 17, and the second conductive semiconductor layer 19 formed on the substrate 11.

Although not shown in drawings, an undoped semiconductor layer that is not doped with dopants may be additionally interposed between the buffer layer 13 and the first conductive semiconductor layer 15, but the embodiment is not limited thereto.

The buffer layer 13, the first conductive semiconductor layer 15, the active layer 17, and the second conductive semiconductor layer 19 include group II-VI compound semiconductor materials, but the embodiment is not limited thereto.

The compound semiconductor material may a material such as aluminum (Al), indium (In), gallium (Ga), and nitrogen (N), but the embodiment is not limited thereto.

The substrate 11 may include a material representing superior thermal conductivity and/or superior transmittance, but the embodiment is not limited thereto. For example, the substrate 11 may include at least one selected from the group consisting of sapphire ($Al_2O_3$), SiC, Si, GaAs, GaN, ZnO, Si, GaP, InP and Ge, but the embodiment is not limited thereto.

The first conductive semiconductor layer 15 may be formed under the substrate 11 or the buffer layer 13.

For example, the first conductive semiconductor layer 15 may include an N type semiconductor layer including N type dopants, but the embodiment is not limited thereto. The first conductive semiconductor layer 15 may include a semiconductor material having a composition formula of $In_xAl_yGa_{1-x-y}N$ ($0 \leq x \leq 1$, $0 \leq y \leq 1$, $0 \leq x+y \leq 1$), for example, at least one selected from the group consisting of InAlGaN, GaN, AlGaN, InGaN, AlN, InN, and AlInN, but the embodiment is not limited thereto. The N type dopant may include Si, Ge, or Sn, but the embodiment is not limited thereto.

The first conductive semiconductor layer 15 may serve as a conductive layer to supply electrons to the active layer 19. The first conductive semiconductor layer 15 may serve as a barrier layer to prevent holes supplied from the second conductive semiconductor layer 19 to the active layer 17 from being transferred to the buffer layer 13.

The first conductive semiconductor layer 15 is doped with dopants at the high concentration to serve as a conductive layer to allow electrons to freely move.

The first conductive semiconductor layer 15 includes a compound semiconductor material having the bandgap equal to or greater than that of the active layer 17 to serve as a barrier layer to prevent the holes of the active layer 17 from being transferred to the buffer layer 13.

The active layer 17 may be formed under the first conductive semiconductor layer 15.

For example, the active layer 17 recombines the electrons supplied from the first conductive semiconductor layer 15 with the holes supplied from the second conductive semiconductor layer 19 to emit ultraviolet light. In order to produce the ultraviolet light, the active layer 17 must have at least a wide bandgap. For example, although the active layer 17 may produce the deep ultraviolet light having the wavelength of 240 nm to 360 nm, the embodiment is not limited thereto.

The active layer 17 may include one of a single quantum well structure (SQW), a multiple quantum well structure (MQW), a quantum point structure, and a quantum wire structure.

The active layer 19 may have a stack structure of a well layer and a barrier layer including a semiconductor including a group III-VI compound having an energy bandgap for generating the ultraviolet light, but the embodiment is not limited thereto.

For example, the active layer 19 may be periodically formed in the stack structure of an InGaN well layer/a GaN barrier layer, or an InGaN well layer/an AlGaN barrier layer, and an InGaN well layer/an InGaN barrier layer. The band gap of the barrier layer may be greater than the bandgap of the well layer. The second conductive semiconductor layer 19 may be formed under the active layer 17.

The second conductive semiconductor layer 19 may include a P type semiconductor layer including P type dopants, but the embodiment is not limited thereto. The second conductive semiconductor layer 19 may include a semiconductor material having a composition formula of $In_xAl_yGa_{1-x-y}N$ ($0 \leq x \leq 1$, $0 \leq y \leq 1$, $0 \leq x+y \leq 1$), for example, at least one selected from the group consisting of InAlGaN, GaN, AlGaN, InGaN, AlN, InN, and AlInN. However, the embodiment is not limited thereto. The P type dopants may include Mg, Zn, Ca, Sr or Ba, but the embodiment is not limited thereto.

The second conductive semiconductor layer 19 may serve as a conductive layer to supply holes to the active layer 17.

The second conductive semiconductor layer 19 is doped with dopants at the high concentration to serve as a conductive layer allowing holes to freely move.

In order to prevent the electrons of the active layer 17 from being transferred to the second conductive semiconductor layer 19, a third conductive semiconductor layer may be interposed between the active layer 17 and the second conductive semiconductor layer 19, but the embodiment is not limited thereto.

In more detail, in addition to the third conductive semiconductor layer, an electron blocking layer may be interposed between the active layer 17 and the second conductive semiconductor layer 19 or between the active layer 17 and the third conductive semiconductor layer in order to prevent electrons of the active layer 17 from being transferred to the second conductive semiconductor layer 19, but the embodiment is not limited thereto.

For example, the third conductive semiconductor layer and the electron blocking layer may include AlGaN, but the embodiment is not limited thereto. For example, the electron blocking layer may have at least the bandgap greater than that of the second conductive semiconductor layer or the third conductive semiconductor layer, but the embodiment is not limited thereto.

For example, when the third conductive semiconductor layer and the electron blocking layer include AlGaN, the electron blocking layer may have the content of Al higher than that of the third conductive semiconductor layer so that the electron blocking layer may have the bandgap greater than that of the third conductive semiconductor layer, but the embodiment is not limited thereto.

At least one or at least two of the side surfaces of the active layer 17 and the second conductive semiconductor layer 19 may protrude outward, but the embodiment is not limited thereto.

Although the distance between the side surface of the first conductive semiconductor layer 15 and the side surfaces of the active layer 17 and the second conductive semiconductor layer 19 may not be uniform. In other words, the distance between the side surface of the first conductive semiconductor layer 15 and the side surfaces of the active layer 17 and the second conductive semiconductor layer 19 may be varied according to the positions thereof.

Preferably, in the flip-type ultraviolet light emitting structure, ultraviolet light is preferably travelled in the lateral direction or the in the front direction toward the substrate 11.

In the flip-chip ultraviolet light emitting structure, the ultraviolet light generated from the active layer 17 may be travelled in all directions.

A portion of the ultraviolet light is not travelled in the upper direction or the front direction toward the substrate 11, but travelled in the lower direction toward the second conductive semiconductor layer 19. If the direction of the light travelled in the lower direction is not changed into the front direction, the light travelled in the lower direction may be absorbed or disappeared in the ultraviolet light emitting device 10, so that the light extraction efficiency may be remarkably lowered.

Figure 3:
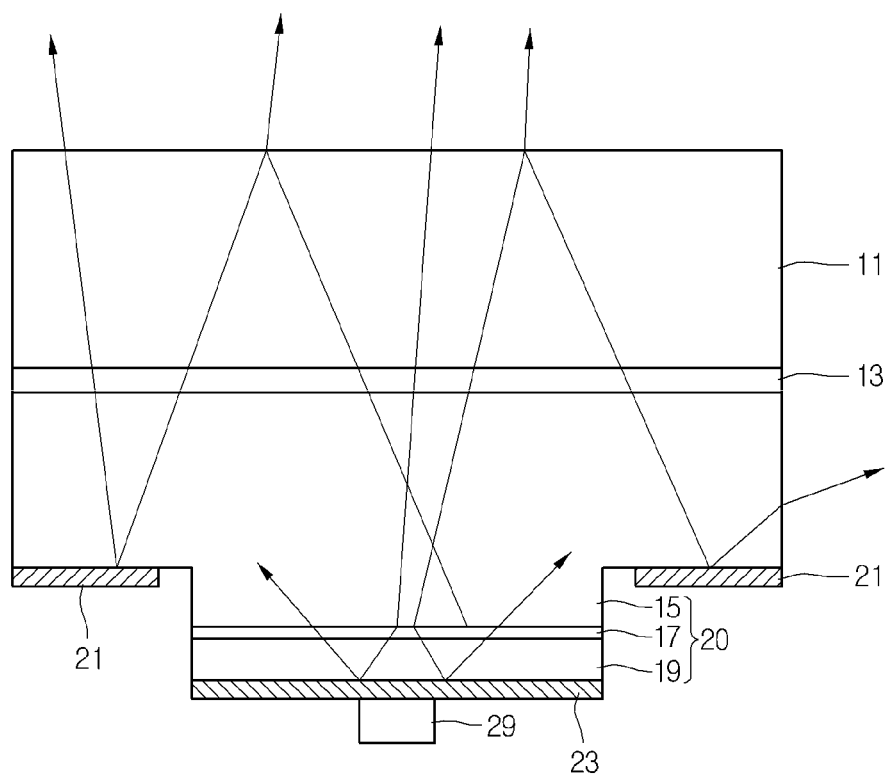
FIG. 3 is a view showing the ultraviolet light emitting device of FIG. 1 outputting ultraviolet light.

In particular, as shown in FIG. 3, even if the ultraviolet light is travelled in the upper direction toward the substrate 11, the ultraviolet light may be output to the outside through the top surface of the substrate 11 due to the difference in the refractive index between the substrate 11 and the air and the wavelength of the ultraviolet light. In addition, a portion of the ultraviolet light may be reflected from the top surface of the substrate 11 so that the portion of the ultraviolet light may be travelled in the lateral direction or the lower direction and thus absorbed or disappeared in the ultraviolet light emitting device 10.

According to the first embodiment, in order to solve the problem, the first and second electrode layers 21 and 23 are provided to reflect the ultraviolet light, which is emitted in the lower direction, in the upper direction, and the ultraviolet light, which is emitted in the upper direction from the active layer 17 and then reflected from the top surface of the substrate 11, may be reflected in the upper direction.

The first electrode layer 21 may be formed on the bottom surface of the first conductive semiconductor layer 15, and the second electrode layer 23 may be formed on the bottom surface of the second conductive semiconductor layer 19.

In order to form the first electrode layer 21 on the bottom surface of the first conductive semiconductor layer 15, the first conductive semiconductor layer 15 covered with the active layer 17 and the second conductive semiconductor layer 19 must be exposed.

That is to say, in order to expose the first conductive semiconductor layer 15, a mesa etching process may be sequentially performed with respect to the second conductive semiconductor layer 19 and the active layer 17.

The first conductive semiconductor layer 15 may be partially etched through the mesa etching process, but the embodiment is not limited thereto. The central region of the first conductive semiconductor layer 15 may protrude in the lower direction beyond the peripheral region of the first conductive semiconductor layer 15. The peripheral region may surround the central region, but the embodiment is not limited thereto.

The peripheral region of the first conductive semiconductor layer 15, which is exposed through the mesa-etching process, is named a first region 41. The active layer 17 and the second conductive semiconductor layer 19, which remain without being mesa-etched, or the first conductive semiconductor layer 15, which is not exposed through the mesa etching process, and the active layer 17 and the second conductive semiconductor layer 19, which correspond to the central region of the first conductive semiconductor layer 15, which is not exposed, is named second region 43. Since the light is generated from the active layer 17, the second region 43 may be named a light emitting region. In addition, since the first region 41 does not generate light, the first region 41 may named a non-light emitting region, but the embodiment is not limited thereto.

The first region 41 may include a groove formed by removing a portion of the second conductive semiconductor layer 19, the active layer 17, and the first conductive semiconductor layer 15. In other words, the groove may have the depth as high as the thickness of both of the active layer 17 and the second conductive semiconductor layer 19. Therefore, the groove may be formed along the peripheral portion of the second region 43, that is, the light emitting region, but the embodiment is not limited thereto. In other words, the groove may be formed along the peripheral portions of the active layer 17 and the second conductive semiconductor layer 19. The groove may be formed on the side surfaces of the active layer 17 and the second conductive semiconductor layer 19.

The size of the first conductive semiconductor layer 15 may be greater than the sizes of the active layer 17 and the second conductive semiconductor layer 19, but the embodiment is not limited thereto. The first conductive semiconductor layer 15 may extend outward from the side surfaces of the active layer 17 and the second conductive semiconductor layer 19. The groove may be formed in the first conductive semiconductor layer 15 that has extended.

Meanwhile, the first and second regions 41 and 43 may be defined on the substrate 11. Accordingly, the first region 41 may be formed therein with the first conductive semiconductor layer 15, and the second region 43 may be formed therein with the first conductive semiconductor layer 15, the active layer 17, and the second conductive semiconductor layer 19. In this case, the bottom surface of the first conductive semiconductor layer 15 formed in the second region 43 may protrude in the lower direction beyond the bottom surface of the first conductive semiconductor layer 15 formed in the first region 41, but the embodiment is not limited thereto.

As shown in FIG. 1, the second region 43 may have the shape of a cross, but the embodiment is not limited thereto.

Figure 8:
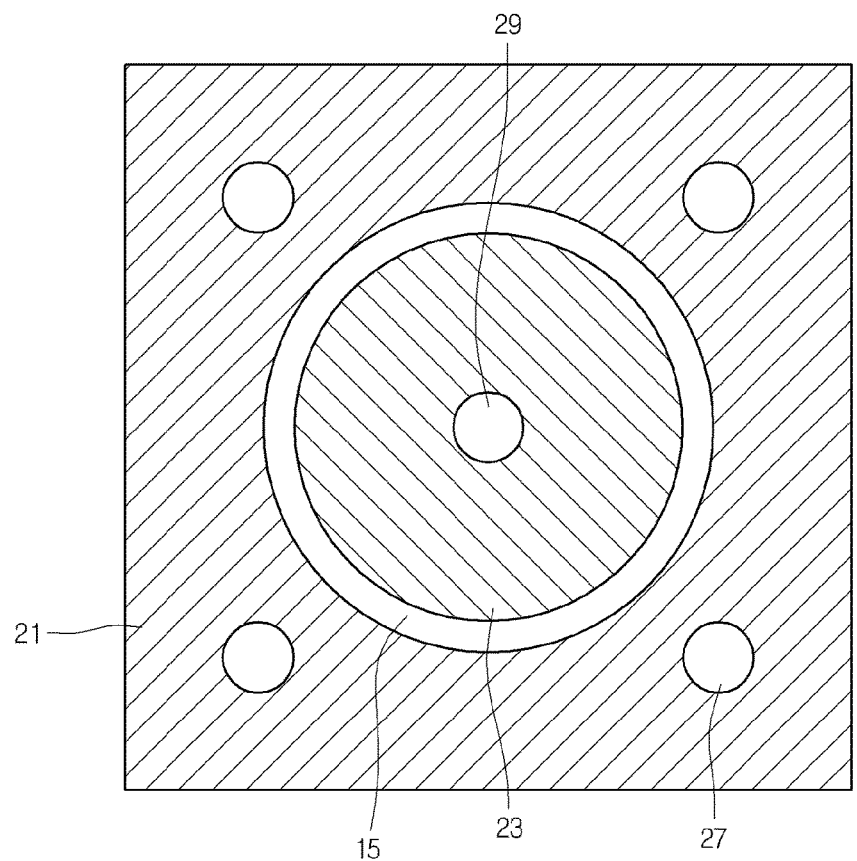
FIG. 8 is a bottom view showing an ultraviolet light emitting device according to a fourth embodiment.
Figure 9:
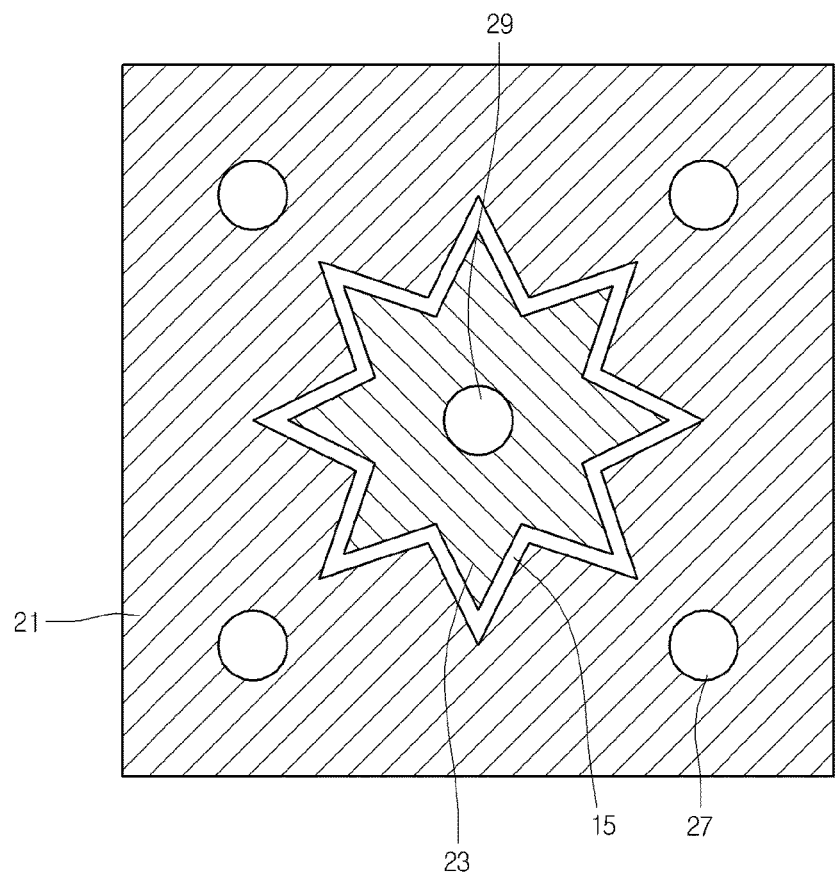
FIG. 9 is a bottom view showing an ultraviolet light emitting device according to a fifth embodiment.

For example, the second region 43 may have the shape of a circle (see FIG. 8) or the shape of a star (see FIG. 9).

In general, the second region 43 has the shape of a rectangle. When comparing with the shape of the rectangle, the shape of the cross, the shape of the circle, and the shape of the star more enlarge the area of the side surface of the active layer 17, which is exposed outside, so that the light extraction efficiency can be more improved.

The first electrode layer 21 may be formed on the bottom surface of the first conductive semiconductor layer 15, that is, the first region 41.

For example, the first electrode layer 21 may be formed on the entire region of the first conductive semiconductor layer 15 which is exposed outside.

In addition, in order to prevent the electrical short between the first and second conductive semiconductor layers 15 and 19 from being caused by the first electrode layer 21, the end portion of the first electrode layer 21 may be spaced apart from the end portion of the second region 43, that is, the side surface of the first conductive semiconductor layer 15 or the active layer 17 which is etched.

The bottom surface of the first electrode layer 21 may be positioned higher than the top surface of the active layer 17. To this end, the central region of the first conductive semiconductor layer 15 making contact with the active layer 17 may protrude in the lower direction beyond the peripheral region of the first conductive semiconductor layer 15 that does not make contact with the active layer 17, but the embodiment is not limited thereto.

Figure 7:
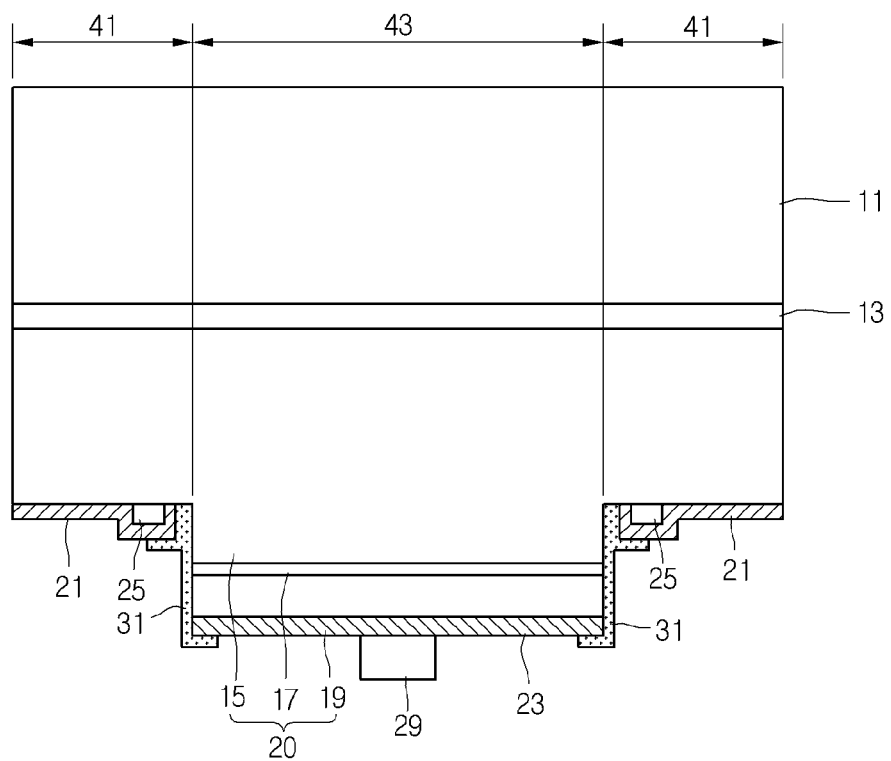
FIG. 7 is a sectional view showing the ultraviolet light emitting device of FIG. 6.

In order to completely prevent the electrical short between the first and second conductive semiconductor layers 15 and 19 caused by the first electrode layer 21, a protective layer 31 may be formed on the side surfaces of the first conductive semiconductor layer 15, the active layer 17, and the second conductive semiconductor layer 19, which are provided in the second region 43, as shown in FIG. 7, but the embodiment is not limited thereto.

In addition, the protective layer 31 may be formed at portions of the bottom surface of the first conductive semiconductor layer 15 and the bottom surface of the first electrode layer 21, which are provided in the first region 41, and a portion of the bottom surface of the second electrode layer provided in the second region 43, but the embodiment is not limited thereto.

In other words, the protective layer 31 may be formed along the peripheral portions of the etched light emitting structure, that is, the peripheral portions of the side surfaces of the first conductive semiconductor layer 15, the active layer 17, and the second conductive semiconductor layer 19, but the embodiment is not limited thereto.

The first electrode layer 21 may reflect the ultraviolet light, which is emitted from the active layer 17 to the substrate 11, reflected from the top surface of the substrate 11, and then travelled in the lower direction, but the embodiment is not limited thereto.

The ultraviolet light generated from the active layer 17 is travelled in all directions, and a portion of the ultraviolet light may be travelled in the upper direction or the front direction toward the substrate 11. Although the ultraviolet light travelled toward the substrate 11 is output to the outside through the top surface of the substrate 11, a portion of the ultraviolet light may be reflected by the top surface of the substrate 11 and thus travelled in the lower direction. The ultraviolet light travelled in the lower direction is reflected by the first electrode layer 21, and thus travelled in the upper direction, so that the ultraviolet light may be output to the outside through the top surface of the substrate 11 or the side surface of the substrate 11.

Ultraviolet light having a narrow main wavelength is reflected in the significant quantity inward from the top surface of the substrate 11. In addition, the first region 41 in which the first conductive semiconductor layer 15 is exposed may occupy a larger area than that of the second region 43 in which the first conductive semiconductor layer 15 is not exposed. In other words, the area of the first region 41 may be greater than the area of the second region 43. In this case, the light extraction efficiency may be lowered as the ultraviolet light reflected from the top surface of the substrate 11 is disappeared, which causes the serious problem.

According to the first embodiment, the first electrode layer 21 is formed on the bottom surface of the first conductive semiconductor layer 15 or in the first region 41, so that the ultraviolet light reflected in the lower direction from the top surface of the substrate 11 is reflected in the upper direction or the lateral direction, thereby significantly improving the light extraction efficiency.

Meanwhile, the second electrode layer 23 may be formed on the bottom surface of the second conductive semiconductor layer 19. In other words, the second electrode layer 23 may be formed on the bottom surface of the second conductive semiconductor layer 19 corresponding to the first conductive semiconductor layer 15 that is not exposed in the mesa etching process.

As shown in FIG. 3, the second electrode layer 23 may reflect the ultraviolet light, which is emitted in the lower direction from the active layer 17, in the upper direction.

The second electrode layer 23 may reflect the ultraviolet light, which is reflected from the top surface of the substrate 11 and travelled in the lower direction to pass through the active layer 17 and the second conductive semiconductor layer 19, in the upper direction.

In addition, the distance between the second electrode layer 23 and the active layer 17 may be longer than the distance between the first electrode layer 21 and the active layer 17, but the embodiment is not limited thereto.

Although not shown in drawings, a transparent conductive layer may be interposed between the second conductive semiconductor layer 19 and the second electrode layer 23, but the embodiment is not limited thereto. The transparent electrode layer may have a current spreading function to spread the current in the lateral direction from the second electrode 29 and an ohmic contact function to easily inject the current into the second conductive semiconductor layer 19, but the embodiment is not limited thereto.

The transparent conductive layer may include at least one selected from the group consisting of ITO, IZO (In—ZnO), GZO (Ga—ZnO), AZO (Al—ZnO), AGZO (Al—Ga ZnO), IGZO (In—Ga ZnO), IrOx, RuOx, RuOx/ITO, Ni/IrOx/Au and Ni/IrOx/Au/ITO, but the embodiment is not limited thereto.

According to the first embodiment, the second electrode layer 23 is formed on the bottom surface of the second conductive semiconductor layer 19 to reflect the ultraviolet light, which is reflected in the lower direction from the top surface of the substrate 11, or the ultraviolet light, which is emitted in the lower direction from the active layer 17, in the upper direction, thereby significantly improving the light extraction efficiency.

The first and second electrode layers 21 and 23 may include a material having superior reflexibility, but the embodiment is not limited thereto.

The first and second electrode layers 21 and 23 may include the same material, or different materials.

The first and second electrode layers 21 and 23 may be formed in a single layer structure or a multiple-layer structure.

The first and second electrode layers 21 and 23 may include opaque metal materials having superior reflexibility and superior conductivity. The first and second electrode layers 21 and 23 may include one selected from the group consisting of Ag, Ni, Al, Rh, Pd, Ir, Ru, Mg, Zn, Pt, Au, and Hf, or the alloy thereof, but the embodiment is not limited thereto.

For example, the first and second electrode layers 21 and 23 may include aluminum (Al) representing superior reflexibility for the ultraviolet light, but the embodiment is not limited thereto.

For example, the first electrode layer 21 includes aluminum (Al), and the second electrode layer 23 may include the alloy of Al/Ni, but the embodiment is not limited thereto.

According to the experimental result, when the first electrode layer 21 includes aluminum (Al), the light extraction efficiency of the ultraviolet light emitting device 10 according to the first embodiment is 16.4%. Meanwhile, when the first electrode layer 21 includes silver (Ag), the light extraction efficiency of the ultraviolet light emitting device 10 according to the first embodiment is 13.8%. Therefore, with respect to the ultraviolet light having the wavelength of 240 nm to 360 nm, the first electrode layer 21 including aluminum (Al) represents reflectance superior to that of the first electrode layer 21 including silver (Ag).

Although not shown in drawings, the bottom surface of the first conductive semiconductor layer 15, which is exposed at the peripheral portion of the active layer 17, and the bottom surface of the second conductive semiconductor layer 19 may have the roughness structure. The roughness structure may have regular concave-convex patterns or random concave-convex patterns, but the embodiment is not limited thereto.

As the first electrode layer 21 is formed on the roughness structure of the first conductive semiconductor layer 15, the first electrode layer 21 may be bonded to the first conductive semiconductor layer 15 while representing the strong adhesive strength, thereby preventing the first electrode layer 21 from deviating from the first conductive semiconductor layer 15. In addition, the ultraviolet light, which is emitted in the lower direction from the active layer, is reflected or scattered due to the roughness structure, so that the light extraction efficiency can be more improved.

The roughness structure formed on the bottom surface of the second conductive semiconductor layer 15 can make the effect the same as the above-described effect.

The first electrode layer 21 and the second electrode layer 23 may be provided at different places spaced apart from each other by the thicknesses of the active layer 17 and the second conductive semiconductor layer 19, but the embodiment is not limited thereto.

Meanwhile, a first electrode 27 may be formed on a portion of the first electrode layer 21, and a second electrode 29 may be formed on a portion of the second electrode layer 23.

The first electrode 27 may have electrical conductivity higher than that of the first electrode layer 21, and the second electrode 29 may have electrical conductivity higher than that of the second electrode layer 23, but the embodiment is not limited thereto.

The first and second electrodes 27 and 29 may include the same material or may include materials different from each other.

The first and second electrodes 27 and 29 may be formed in a single layer structure or may be formed in a multiple-layer structure.

The first and second electrodes 27 and 29 may include a metal material representing superior electrical conductivity. For example, the first and second electrodes 27 and 29 may include one selected from the group consisting of aluminum (Al), titanium (Ti), chrome (Cr), nickel (Ni), platinum (Pt), gold (Au), tungsten (W), copper (Cu), and molybdenum (Mo) or the alloy thereof, but the embodiment is not limited thereto.

The first electrode 27 may be formed on at least one of first electrode layers 21 of the first regions 41, but the embodiment is not limited thereto.

Although not shown in drawings, the first electrode 27 may be formed on the entire top surface of the first electrode layer 21 provided in the first region 41, but the embodiment is not limited thereto.

The first electrode layer 21 may not only serve as a reflective layer to reflect the ultraviolet light, but also serve as an electrode to supply power. In this case, the first electrode 27 may not be formed, but the embodiment is not limited thereto.

The second electrode layer 23 may not only serve as a reflective layer to reflect the ultraviolet light, but also serve as an electrode to supply power. In this case, the second electrode 29 may not be formed, but the embodiment is not limited thereto.

The first and second electrodes 27 and 29 may have the shape of a cylinder, but the embodiment is not limited thereto.

Figure 4:
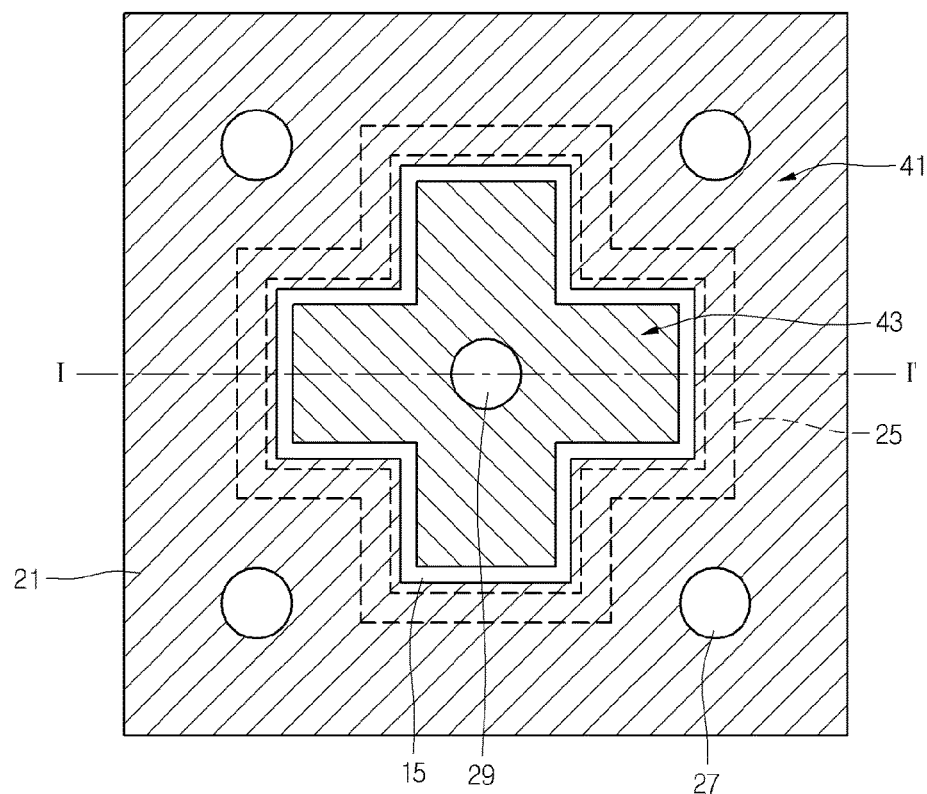
FIG. 4 is a bottom view showing an ultraviolet light emitting device according to a second embodiment.
Figure 5:
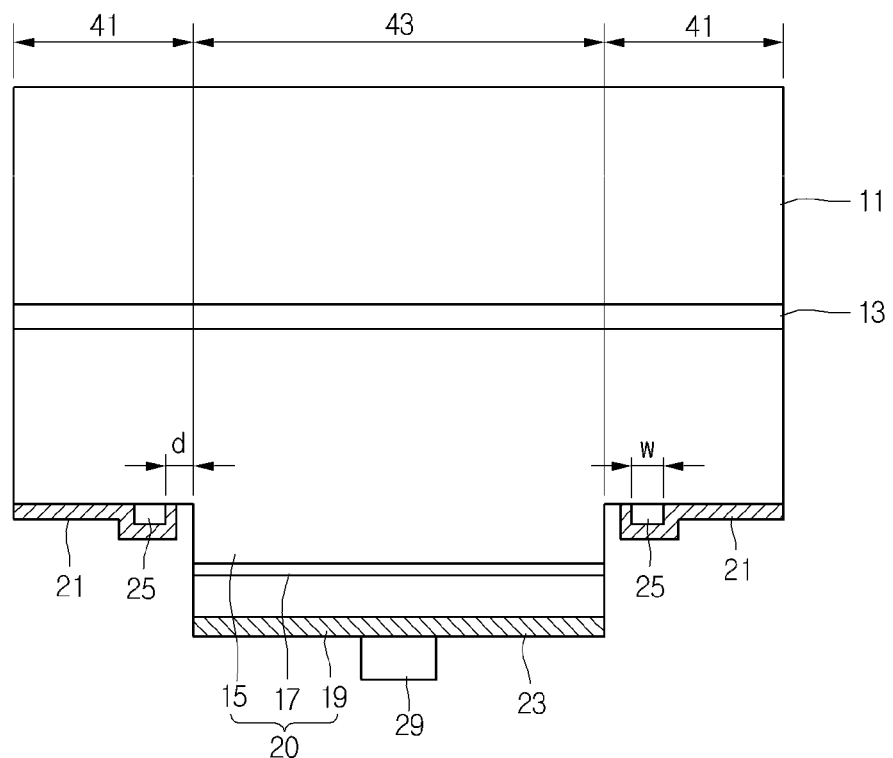
FIG. 5 is a sectional view showing the ultraviolet light emitting device of FIG. 4.

FIG. 4 is a bottom view showing the ultraviolet light emitting device according to the second embodiment, and FIG. 5 is a sectional view showing the ultraviolet light emitting device of FIG. 4.

The second embodiment is substantially the same as the first embodiment except for an ohmic layer 25.

According to the second embodiment, the same reference numerals will be assigned to the components the same as those of the first embodiment, and the details thereof will be omitted.

Referring to FIGS. 4 and 5, a ultraviolet light emitting device 10A according to the second embodiment may include the substrate 11, the first conductive semiconductor layer 15, the active layer 17, the second conductive semiconductor layer 19, the ohmic layer 25, the first and second electrode layers 21 and 23, and the first and second electrodes 27 and 29.

The ohmic layer 25 may be interposed between the first conductive semiconductor layer 15 and the first electrode layer 21.

The first electrode layer 21 may fully or partially cover the ohmic layer 25, but the embodiment is not limited thereto. In other words, although the first electrode layer 21 is provided on the outer surface and the bottom surface of the ohmic layer 25, the first electrode layer 21 may not be provided on the inner surface of the ohmic layer 25, but the embodiment is not limited thereto.

The ohmic layer 25 may be provided along the periphery of the active layer 17, but the embodiment is not limited thereto. The ohmic layer 25 may have a closed-loop shape or an open-loop shape, but the embodiment is not limited thereto.

The ohmic layer 25 may be formed in the first region 41 defined by the first conductive semiconductor layer 15 exposed to the outside through the mesa etching process.

The ohmic layer 25 may include a transparent conductive material. For example, the ohimic layer 25 may include at least one selected from the group consisting of ITO (indium tin oxide), IZO (indium zinc oxide), IZTO (indium zinc tin oxide), IAZO(indium aluminum zinc oxide), IGZO (indium gallium zinc oxide), IGTO (indium gallium tin oxide), AZO (aluminum zinc oxide), ATO (antimony tin oxide), GZO (gallium zinc oxide), IrOx, RuOx, RuOx/ITO, Ni, Ag, Ni/IrOx/Au, and Ni/IrOx/Au/ITO.

The ohmic layer 25 is formed in the closed-loop structure along the peripheral portion of the second region 43 defined by the second conductive semiconductor layer 19 corresponding to the first conductive semiconductor layer that is not exposed to the outside in the mesa-etching process, but the embodiment is not limited thereto. In other words, the ohmic layer 25 may be formed on the first conductive semiconductor layer 15 along the periphery of the light emitting structure 20.

For example, the ohmic layer 25 may be formed adjacent to the side surface of the active layer 17 provided in the second region 43.

The ohmic layer 25 may be spaced apart from the side surface of the active layer 17 provided in the second region 43.

The distance d between the ohmic layer 25 and the second region 43 may be in the range of 1 μm to about 10 μm, but the embodiment is not limited thereto.

In other words, the first conductive semiconductor layer 15 of the second region 43 may protrude in the lower direction beyond the first conductive semiconductor layer 15 of the first region 41. The active layer 17 and the second conductive semiconductor layer 19 may be provided under the first conductive semiconductor layer 15 of the first region 41. The side surface of the first conductive semiconductor layer 15 is provided by the thickness between the bottom surface of the first conductive semiconductor layer 15 of the first region 41 and the bottom surface of the first conductive semiconductor layer 15 of the first region 43. In this case, the distance d between the ohmic layer 25 and the second region 43 may be in the range of 1 μm to about 10 μm, but the embodiment is not limited thereto.

In order to rapidly apply current to the active layer, the ohmic layer 25 is preferably close to the active layer 17 as much as possible.

Although not shown in drawings, if the electrical short with the active layer 17 does not occur, the ohmic layer 25 may make contact with the side surface of the first conductive semiconductor layer 15. In this case, the first conductive semiconductor layer 15 may be more deeply etched so that the bottom surface of the first conductive semiconductor layer 15 is spaced away from the side surface of the active layer 17.

The ohmic layer 25 may be formed in the shape of a bar along the peripheral portion of the second region 43.

The width w of the ohmic layer 25 may be in the range of about 5 μm to about 30 μm, but the embodiment is not limited thereto.

The area of the ohmic layer 25 may be equal to or narrower than that of the first electrode layer 21, but the embodiment is not limited thereto.

In addition, the ohmic layer 25 may be formed on the entire region of the first conductive semiconductor layer 15 provided in the first region 41, but the embodiment is not limited thereto.

According to the second embodiment, the ohmic layer 25 is formed on the bottom surface of the first conductive semiconductor layer 15 to smoothly supply power to the first conductive semiconductor layer 156, and to perform a current spreading function allowing current to more widely spread in the lateral direction within the first conductive semiconductor layer 15, so that the light emission efficiency can be improved, and the uniform ultraviolet light can be ensured.

The first electrode layer 21 may cover all of the side surface and the bottom surface of the ohmic layer 25. In other words, the first electrode layer 21 may surround the ohmic layer 25. The ohmic layer 25 makes surface-contact with the first electrode layer 21 as much as possible, so that the power is supplied from the first electrode 27 to the side surface and the bottom surface of the ohmic layer 25 through the first electrode layer 21. Accordingly, the power can be more smoothly supplied to the first conductive semiconductor layer 15.

Although not shown in drawings, the first electrode layer 21 may be overlapped with a portion of the bottom surface and the outer surface of the ohmic layer 25, but the embodiment is not limited thereto. In other words, the first electrode layer 21 may not be formed on the side surface of the first conductive semiconductor layer 15 provided in the second region 43.

Figure 6:
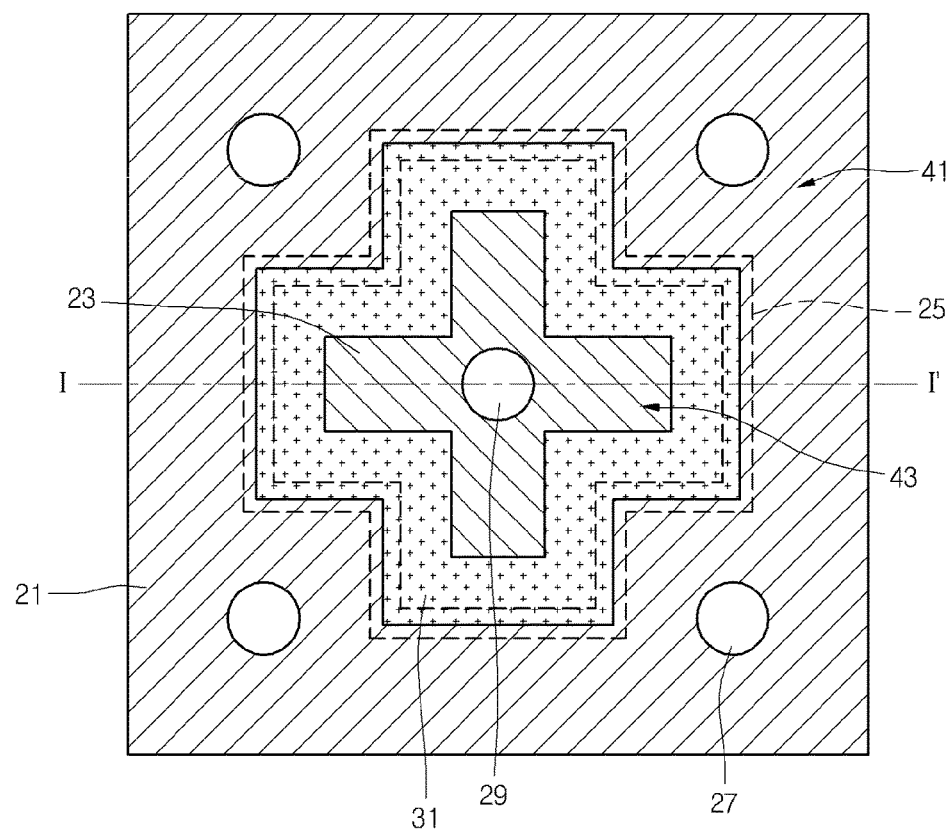
FIG. 6 is a bottom view showing an ultraviolet light emitting device according to a third embodiment.

FIG. 6 is a bottom surface showing an ultraviolet light emitting device according to the third embodiment, and FIG. 7 is a sectional view showing the ultraviolet light emitting device of FIG. 6.

The third embodiment is substantially the same as the second embodiment except for the protective layer 31.

According to the third embodiment, the same reference numerals will be assigned to the components the same as those of the first and second embodiments, and the details thereof will be omitted.

Referring to FIGS. 6 and 7, a ultraviolet light emitting device 10B according to the third embodiment may include the substrate 11, the first conductive semiconductor layer 15, the active layer 17, the second conductive semiconductor layer 19, the ohmic layer 25, the first and second electrode layers 21 and 23, the protective layer 31, and the first and second electrodes 27 and 29.

As described above, according to the first embodiment, in order to completely prevent the electrical short between the first and second conductive semiconductor layers 15 and 19 caused by the first electrode layer 21, the protective layer 31 may be formed on the side surfaces of the first conductive semiconductor layer 15, the active layer 17, and the second conductive semiconductor layer 19, which are exposed to the outside in the second region 43, as shown in FIG. 7, but the embodiment is not limited thereto.

The second region 43 includes the first conductive semiconductor layer 15 that is not etched through the mesa etching process, and the active layer 17 and the second conductive semiconductor layer 19 corresponding to the first conductive semiconductor layer 15.

The first region 41 may include the first conductive semiconductor layer 15 that is etched through the mesa etching process and thus exposed to the outside.

The first region 41 may be a non-light emitting region, and the second region 43 may be a light emitting region.

The protective layer 31 may be provided on the side surface of the light emitting structure 20. The protective layer 31 may be provided on at least the side surface of the active layer 17, but the embodiment is not limited thereto. The protective layer 31 may be provided on the side surfaces of the first conductive semiconductor layer 15, the active layer 17, and the second conductive semiconductor layer 19 that are provided in the second region 43. In addition, the protective layer 31 may be provided on the ohmic layer 25 and the side surface of the first conductive semiconductor layer 17 provided in the second region 43.

The protective layer 31 may be formed on the bottom surface of the first conductive semiconductor layer 15 provided in the first region 41 and interposed between the first electrode layer 21 and the side surface of the first conductive semiconductor layer 15 provided in the second region 43.

The protective layer 31 may be formed on a portion of the bottom surface of the first conductive semiconductor layer 15 provided in the first region 41, a portion of the first electrode layer 21, and a side surface of the light emitting structure 20, that is, the side surfaces of the conductive semiconductor layer 15, the active layer 17, the second conductive semiconductor layer 19, and the second electrode layer 23 that are provided in the second region 43, and may be formed on a portion of the bottom surface of the second electrode layer 23.

The protective layer 31 may include a material representing superior transparency and low conductivity or an insulating material. For example, the protective layer 31 may include at least one selected from the group consisting of $SiO_2$, $Si_xO_y$, $Si_3N_4$, $Si_xN_y$, $Al_2O_3$, and $TiO_2$, but the embodiment is not limited thereto.

According to the embodiment, the first electrode layer 21 is formed on the bottom surface of the first conductive semiconductor layer 15 or formed in the first region 41, thereby reflecting the ultraviolet light, which is reflected in the lower direction from the top surface of the substrate 11, in the upper direction, so that the light extraction efficiency can be significantly improved.

According to the embodiment, the second electrode layer 23 is formed on the bottom surface of the second conductive semiconductor layer 19, thereby reflecting the ultraviolet light, which is reflected in the lower direction from the top surface of the substrate 11, or the ultraviolet light, which is emitted in the lower direction from the active layer 17, in the upper direction, so that the light extraction efficiency can be significantly improved.

According to the embodiment, the ohmic layer 25 is formed on the bottom surface of the first conductive semiconductor layer 15 of the first region 41 to more smoothly supply power to the first conductive semiconductor layer 15, and to allow current to more widely flow in the lateral direction within the first conductive semiconductor layer 15, so that the light emission efficiency can be improved, and the uniform ultraviolet light can be ensured.

Figure 10:
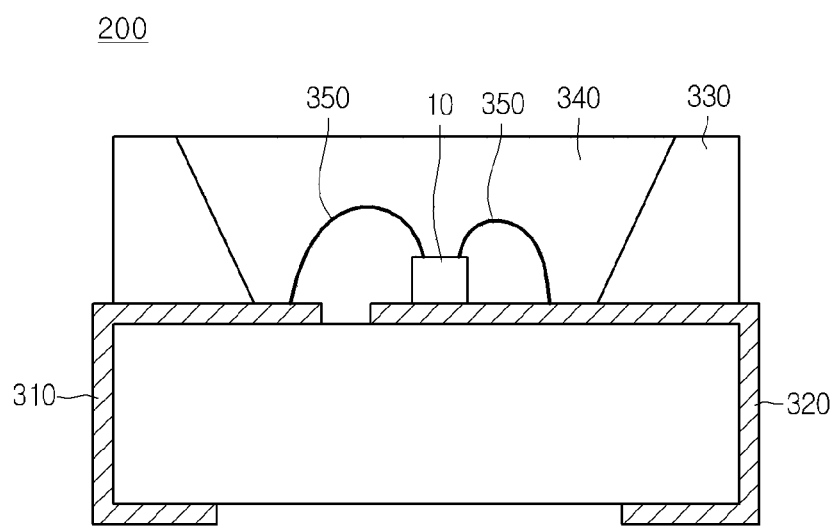
FIG. 10 is a sectional view showing a light emitting device package according to the embodiment.

FIG. 10 is a sectional view showing a light emitting device package 200 according to the embodiment.

Referring to FIG. 10, the light emitting device package 200 according to the embodiment includes a body 330, first and second lead frames 310 and 320 installed in the body 330, the light emitting device 10 according to the first to third embodiments installed in the body 330 to receive power from the first and second lead frames 310 and 320, and a molding member 340 surrounding the light emitting device 10.

The body 330 may include a silicon material, a synthetic resin material, or a metal material, and may have inclined surfaces formed at the peripheral portion of the light emitting device 10.

The first and second lead frames 310 and 320 are electrically insulated from each other and supply the power to the light emitting device 10.

In addition, the first and second lead frames 310 and 320 reflect the light emitted from the light emitting device 10 to increase the optical efficiency, and discharge the heat emitted from the light emitting device 10 to the outside.

The light emitting device 10 may be mounted on one of the first lead frame 310, the second lead frame 320, and the body 330, and may be electrically connected to the first and second lead frames 310 and 320 through a wire scheme or a die bonding scheme, but the embodiment is not limited thereto.

According to the embodiments, although the light emitting device 10 according to the first embodiment is electrically connected to the first and second lead frames 310 and 320 through two wires 350 for the illustrative purpose, the light emitting device 10 according to the second embodiment may be electrically connected to the first and second lead frames 310 and 320 without the wire 350, and the light emitting device 10 according to the third embodiment may be electrically connected to the first and second lead frames 310 and 320 through one wire 350.

The molding member 340 may surround the light emitting device 10 to protect the light emitting device 10. In addition, the molding member 340 may include a phosphor to change the wavelength of the light emitted from the light emitting device 10.

In addition, the light emitting device package 200 includes a chip on board (COB) type light emitting device package. The body 330 may have a flat top surface, and be provided therein with a plurality of light emitting devices 10.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:
1. A light emitting device comprising:
a substrate;
a light emitting structure on the substrate and including a plurality of compound semiconductors, the light emitting structure including:

at least a first conductive semiconductor layer, the first conductive semiconductor layer having a first surface and a second surface provided at a peripheral region of the first surface of the first conductive semiconductor layer;
an active layer on the first conductive semiconductor layer;
a second conductive semiconductor layer on the active layer;
a first electrode layer on the second surface of the first conductive semiconductor layer;
a second electrode layer on a surface of the second conductive semiconductor layer, the second electrode layer including a first surface and a second surface;
a third electrode layer on the first electrode layer; and
a protective layer disposed between the first electrode layer and the second electrode layer,
wherein the protective layer contacts the first surface and the second surface of the first conductive semiconductor layer, the first surface and the second surface of the second electrode layer, the active layer, and the second conductive semiconductor layer,
wherein the active layer is disposed between the first conductive semiconductor layer and the second conductive semiconductor layer,
wherein the first electrode layer is spaced apart from a side surface of the active layer, and the first electrode layer is provided along a peripheral portion of the active layer,
wherein the first electrode layer and the third electrode layer are vertically overlapped with the protective layer,
wherein the third electrode layer comprises an ohmic layer on the second surface of the first conductive semiconductor layer, and
wherein the ohmic layer has a closed-loop shape surrounding the side surface of the active layer.

2. The light emitting device of claim 1, wherein the first electrode layer includes one or two or more layers.

3. The light emitting device of claim 1, wherein the first electrode layer includes a material to reflect an ultraviolet light having a wavelength in a range of 240 nm to 500 nm.

4. The light emitting device of claim 1, wherein a height difference between the second surface of the first conductive semiconductor layer and a third surface of the first conductive semiconductor layer is a thickness of the active layer and the second conductive semiconductor layer.

5. The light emitting device of claim 1, wherein the first conductive semiconductor layer extends to an outer side direction with respect to a side surface of the active layer.

6. The light emitting device of claim 1, further comprising:
a groove formed along a peripheral portion of the first conductive semiconductor layer corresponding to the first surface and having a depth corresponding to a thickness of at least the active layer and the second conductive semiconductor layer.

7. The light emitting device of claim 1, wherein the first electrode layer has a bottom surface disposed at a position higher than that of a top surface of the active layer.

8. The light emitting device of claim 1, wherein the first surface of the first conductive semiconductor layer protrudes in a lower direction with respect to the second surface.

9. The light emitting device of claim 1, wherein one or two or more portions of side surfaces of the active layer and the second conductive semiconductor layer protrude to an outer side direction.

10. The light emitting device of claim 1, wherein a distance between a side surface of the first electrode layer and a side surface of the second electrode layer is 1-10 μm.

11. The light emitting device of claim 1, further comprising:
a first electrode on the first electrode layer; and
a second electrode on the second electrode layer.

12. The light emitting device of claim 1, wherein the protective layer has a circular shape and surrounds the second electrode layer.

13. The light emitting device of claim 1, wherein a width of the third electrode layer is less than a width of the first electrode layer, and
wherein the first electrode layer is in contact with both a side surface and a top surface of the third electrode layer.

14. A light emitting device comprising:
a substrate;
a light emitting structure on the substrate and including a plurality of compound semiconductors, the light emitting structure including:
at least a first conductive semiconductor layer, the first conductive semiconductor layer having a first surface and a second surface provided at a peripheral region of the first surface of the first conductive semiconductor layer, and the first surface of the first conductive semiconductor layer protruding in a lower direction with respect to the second surface of the first conductive semiconductor layer;
an active layer on the first conductive semiconductor layer;
a second conductive semiconductor layer on the active layer;
a first electrode layer on the second surface of the first conductive semiconductor layer;
a second electrode layer on a surface of the second conductive semiconductor layer, the second electrode layer including a first surface and a second surface;
a third electrode layer on the first electrode layer; and
a protective layer disposed between the first electrode layer and the second electrode layer, and between a side surface of the active layer and the first electrode layer,
wherein the protective layer contacts the first surface and the second surface of the first conductive semiconductor layer, the first surface and the second surface of the second electrode layer, the active layer, and the second conductive semiconductor layer,
wherein the active layer is disposed between the first conductive semiconductor layer and the second conductive semiconductor layer,
wherein the first electrode layer is provided along a peripheral portion of the active layer,
wherein the first electrode layer and the third electrode layer are vertically overlapped with the protective layer,
wherein the third electrode layer comprises an ohmic layer on the second surface of the first conductive semiconductor layer, and
wherein the ohmic layer has a closed-loop shape surrounding the side surface of the active layer.

15. The light emitting device of claim 14, wherein the protective layer has a circular shape and surrounds the second electrode layer.

16. The light emitting device of claim 14, wherein a distance between a side surface of the first electrode layer and a side surface of the second electrode layer is 1-10 μm.

17. The light emitting device of claim 14, wherein a width of the third electrode layer is less than a width of the first electrode layer, and wherein the first electrode layer is in contact with both a side surface and a top surface of the third electrode layer.

18. An ultraviolet light emitting device comprising:

a substrate;

a light emitting structure on the substrate and including a plurality of compound semiconductors, the light emitting structure including:

at least a first conductive semiconductor layer;

an active layer on the first conductive semiconductor layer; and a second conductive semiconductor layer on the active layer, the first conductive semiconductor layer having a first surface corresponding to a light emitting region and a second surface provided at a peripheral region of the first surface, the active layer and the second conductive semiconductor layer provided on the first surface at the light emitting region;

a transparent conductive layer including an ohmic layer and disposed on the second surface of the first conductive semiconductor layer;

a first reflective metal layer on the second surface of the first conductive semiconductor layer and the transparent conductive layer; and a second reflective metal layer on an entire upper surface of the second conductive semiconductor layer, wherein the transparent conductive layer and the first reflective metal layer are spaced apart from a side surface of the active layer, and wherein the transparent conductive layer has a closed-loop shape surrounding the side surface of the active layer.

* * * * *